United States Patent [19]
Miyazawa et al.

[11] Patent Number: 5,395,772
[45] Date of Patent: Mar. 7, 1995

[54] SOI TYPE MOS TRANSISTOR DEVICE

[75] Inventors: Yoshihiro Miyazawa; Makoto Hashimoto, both of Kanagawa, Japan

[73] Assignee: Sony Corporation, Tokyo, Japan

[21] Appl. No.: 213,815

[22] Filed: Mar. 17, 1994

Related U.S. Application Data

[63] Continuation of Ser. No. 795,487, Nov. 21, 1991, abandoned.

[30] Foreign Application Priority Data

Nov. 23, 1990 [JP] Japan .................. 2-122541 U

[51] Int. Cl.$^6$ .................. H01L 21/265; H01L 29/68
[52] U.S. Cl. ...................................... 437/29; 437/30; 437/44; 437/84; 437/913; 257/336; 257/344; 257/347
[58] Field of Search ................. 357/234; 257/335, 336, 257/343, 344, 347; 437/15, 29, 30, 44, 84, 913

[56] References Cited

U.S. PATENT DOCUMENTS

| | | |
|---|---|---|
| 4,575,925 | 3/1986 | Kanbara et al. |
| 4,939,558 | 7/1990 | Smayling et al. .................. 257/344 |
| 5,089,865 | 2/1992 | Mitsui et al. .................. 357/23.4 |
| 5,170,232 | 12/1992 | Narita .................. 257/336 |

OTHER PUBLICATIONS

Hashimoto et al, "Low Leadage SOIMOSFETs Fabricated Using a Wafer Bonding Method", *Extended Abstract of the 21st Conference on Solid State Devices and Materials,* Tokyo, 1989, pp. 89–92.

*Primary Examiner*—Edward Wojciechowicz
*Attorney, Agent, or Firm*—Hill, Steadman & Simpson

[57] ABSTRACT

An SOIMOS transistor device which comprises a substrate, an insulating film formed on the substrate, a source and a drain sandwiching a channel region therebetween and formed on the insulating film is described. The channel region has regions in contact with the source and the drain, respectively, and each region has a concentration of an impurity lower than those of the source and the drain, and a gate electrode is formed on the SOI layer. The regions are formed by diffusion of the impurity from the source and the drain in lateral directions, respectively, and extending beneath the gate electrode along the thickness of the source and the drain.

2 Claims, 4 Drawing Sheets

ION IMPLANTATION

SIDE DIFFUSION

ION IMPLANTATION

SOI TYPE MOS TRANSISTOR DEVICE

This is a continuation, of application Ser. No. 07/795,487, filed Nov. 21, 1991, now abandoned.

BACKGROUND OF THE INVENTION

1. Field of The Invention

This invention relates to an SOIMOS transistor device of the type wherein the source resistance is low and the drain breakdown voltage is high.

2. Description Of The Prior Art

Known (LDD)MOS transistor devices are those as shown in section in FIGS. 1 to 3 wherein FIG. 1 is a sectional view of an LDD-type MOS transistor. In recent years, in order to increase a drain breakdown voltage, many attempts have been made to fabrication of MOD transistor devices which have an LDD structure. FIG. 1 shows a MOS transistor device of the LDD structure. In the figure, indicated at 1 is a p-type semiconductor substrate, at 2 is an n+-type source, at 3 is an n+-type drain, at 4 is an n−-type lightly doped source region, at 5 is an n−-type lightly doped drain region, at 6 is a gate insulating film, at 7 is a gate electrode and at 8 is side walls formed on the side walls of the gate electrode 7.

This type of SOIMOS transistor device is formed, prior to formation of the side walls 8, by implanting impurity ions through the mask of the gate electrode 7 to form the lightly doped source region 4 and the lightly doped drain region 5. Then, the side walls 8 are formed, followed by ion implantation of an impurity through the mask of the gate electrode 7 and the side walls 8 to form the source 2 and the drain 3. The formation of the lightly doped region 5 permits impact ionization to be reduced which will take place at the end side of the drain of the channel, eventually leading to an increase of the drain breakdown voltage.

However, the MOS transistor has the problem that the parasitic resistance at the side of the source becomes great with a lowering of gm. This is because the MOS transistor device having the LDD structure is so arranged that the lightly doped regions 4,5 are turned away from the lower side toward the outside of the gate electrode 7 or toward the sides of the source 2 and the drain 3.

In order to increase the breakdown voltage of the drain without increasing the source resistance, attempts have been made to position the lightly doped regions 4,5 below the gate electrode 7.

FIGS. 2 and 3 are, respectively, sectional views of the devices made by such attempts.

FIG. 2 shows a MOS transistor device wherein a gate electrode 17a is made thin at the end portions of the source and drain sides. An impurity is subjected to ion implantation through the mask of the gate electrode 17a to form a source 12 and a drain 13 having lightly doped regions 14, 15 beneath the thin end portions at the source and drain sides.

The MOS transistor device of FIG. 3 has a lightly doped region with a low surface impurity concentration below a gate electrode 27, as indicated by the broken line, by ion implantation in an oblique direction through thermal treatment.

However, the MOS transistor of FIG. 2 has the problem that the gate electrode 17a has to be formed as having partially different thicknesses, involving a complicated procedure. The MOS transistor device of FIG. 3 has also the problem that it is difficult to properly control the concentration distributions of a source 22 and a drain 23 as desired, i.e. the process control is difficult, with relatively poor reproducibility and, thus, it is difficult to reproduce desired characteristics.

OBJECTS AND SUMMARY OF THE INVENTION

An object of the invention is to provide an SOIMOS transistor device which has a small source resistance and a high drain breakdown voltage without involving the difficulty in the process control and an additional number of steps.

Another object of the invention is to provide an SOIMOS transistor device which has source and drain regions, a gate electrode, and low impurity concentration regions extending beneath the gate electrode by diffusion of an impurity from the source and drain regions along the lateral directions.

According to the invention, there is provided an SOIMOS transistor device which comprises a substrate, an insulating film formed on the substrate, a source and a drain sandwiching a channel region therebetween and formed on the insulating film, the channel region having regions in contact with the source and the drain, respectively, and each region having a concentration of an impurity lower than those of the source and the drain, and a gate electrode formed on the channel region the lower concentration regions being formed by diffusion of the impurity from the source and the drain in lateral directions, respectively, and extending beneath the gate electrode along the thickness of the source and the drain.

DESCRIPTION OF THE PREFERRED EMBODIMENTS

Figure 1:
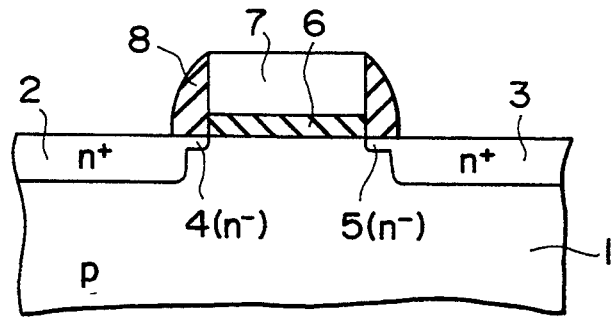
FIG. 1 is a sectional view of a known MOS transistor device having a LDD structure with side walls.
Figure 2:
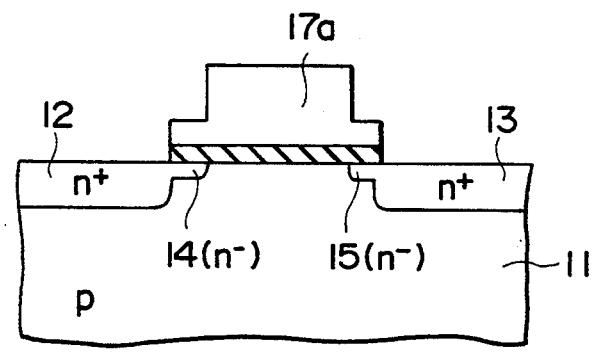
FIG. 2 is a sectional view of another known MOS transistor device having lightly doped regions at source and drain sides.
Figure 3:
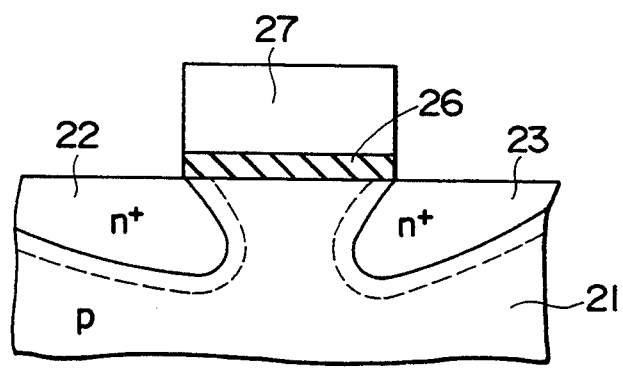
FIG. 3 is a sectional view of a further known MOS transistor device wherein ions are implanted in an oblique direction.

The SOIMOS transistor device of the invention is described in detail with reference to the accompanying drawings and particularly, to FIG. 4.

In the figure, there is shown a transistor device which has a semiconductor substrate 39. The substrate 39 has an insulating film 30 having a thickness, for example, of 0.1 μm and an channel region 31 formed on the insulating film 30. The SOI layer which consists of channel region 31, source 32 and drain 33 is formed in a thickness, for example, of 0.1 μm. Indicated at 32 is an n+-type source, at 33 is an n+ drain, at 34 is an n−-type lightly doped source region and at 35 is an n⁻-type lightly doped drain region. These are arranged as shown in the figure. A gate insulating film having a thickness, for example, of 0.01 μm is formed on the channel region 31 and the regions 34 and 35, on which a polysilicon gate electrode having a thickness, for example, of 0.3 μm is formed.

In the SOIMOS transistor device having such an arrangement as set out above, the source 32 and the drain 33 are formed by ion implantation of an impurity using the gate electrode 37 as a mask. As a result, any impurity is not implanted beneath the gate electrode 37. In contrast, the lightly doped region 34 and the lightly doped region 35 are formed by diffusing impurities from the source 32 and the drain 33 in a lateral direction (i.e. by side diffusion), so that the impurities are present beneath the gate electrode 37.

This is why the SOIMOS transistor of the invention has a small source resistance and a high drain breakdown voltage.

Figure 4:
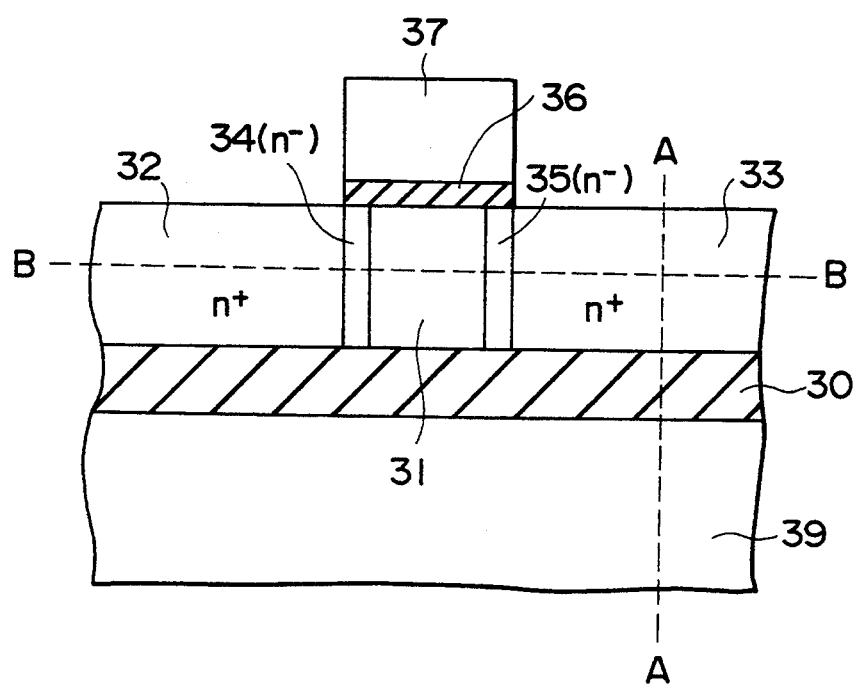
FIG. 4 is a sectional view of an SOIMOS transistor device according to the invention.
Figure 5A:
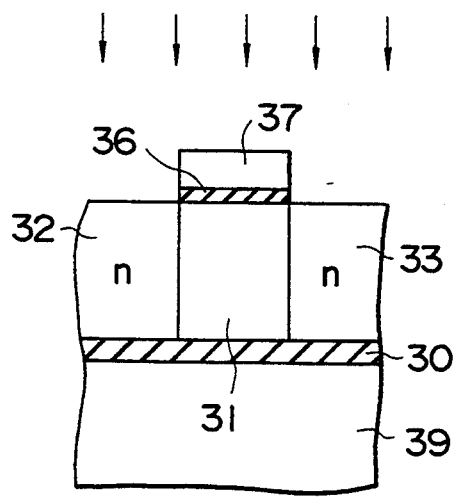
FIGS. 5A to 5C are, respectively, schematic views illustrating a fabrication process of the SOIMOS transistor of the invention.
Figure 5B:
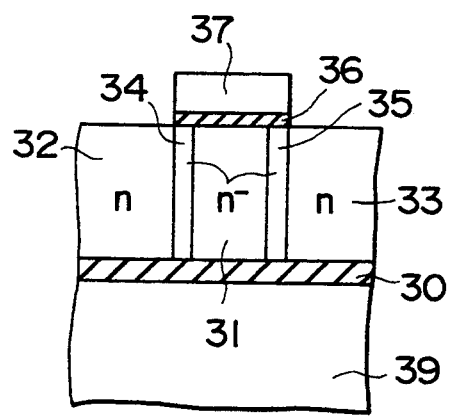
Figure 5C:
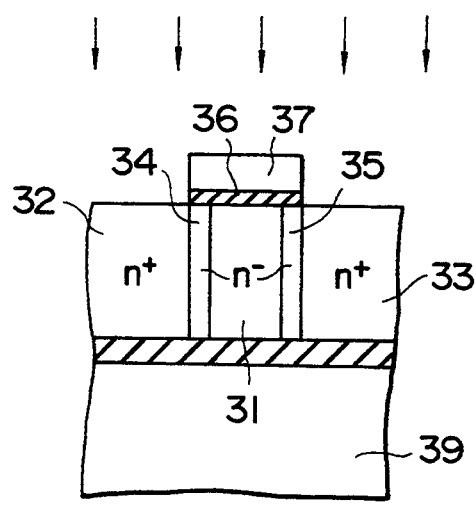

The fabrication of the SOIMOS transistor shown in FIG. 4 is illustrated step by step in FIGS. 5(A) to 5(C).

(A) The gate electrode 37 is formed on the SOI layer through the gate insulating film 36 by a usual manner, after which an n-type impurity is implanted through the mask of the gate electrode 37 into the SOI layer 31 as shown in FIG. 5(A), thereby forming the source 32 and the drain 33. At this stage, the impurity concentration in the source 32 and the drain 33 is not so high.

(B) Thereafter, the impurity in the source 32 and the drain 33 is subjected to side diffusion by thermal treatment sufficient to cause the side diffusion, so that, as shown in FIG. 5(B), there are formed the lightly doped source region 34 and the lightly doped drain region 35 which, respectively, extend inwardly from the source 32 and the drain 33 to the portions under the gate electrode 37 as shown in the figure.

(C) Subsequently, an impurity is ion-implanted through the mask of the gate electrode 37 into the SOI layer 31 as shown in FIG. 5(C), thereby increasing the impurity concentration of the source 32 and the drain 33.

As will be apparent from the above description, there can be simply obtained an SOIMOS transistor device, which has a low source resistance and a high drain breakdown voltage, without involving any difficulty in the process control. If the above procedure is applied to fabrication of a bulk MOS transistor device, the junction depth of the source 32 and the drain 33 becomes great, causing the short channel effect. However, with the SOIMOS transistor device wherein the insulating film 30 is provided below the semiconductor layer 31, the short channel effect is unlikely to occur.

The reason why the side diffusion takes place uniformly along the longitudinal direction or along the thickness is described with reference FIGS. 4, 6 and 7.

Figure 6:
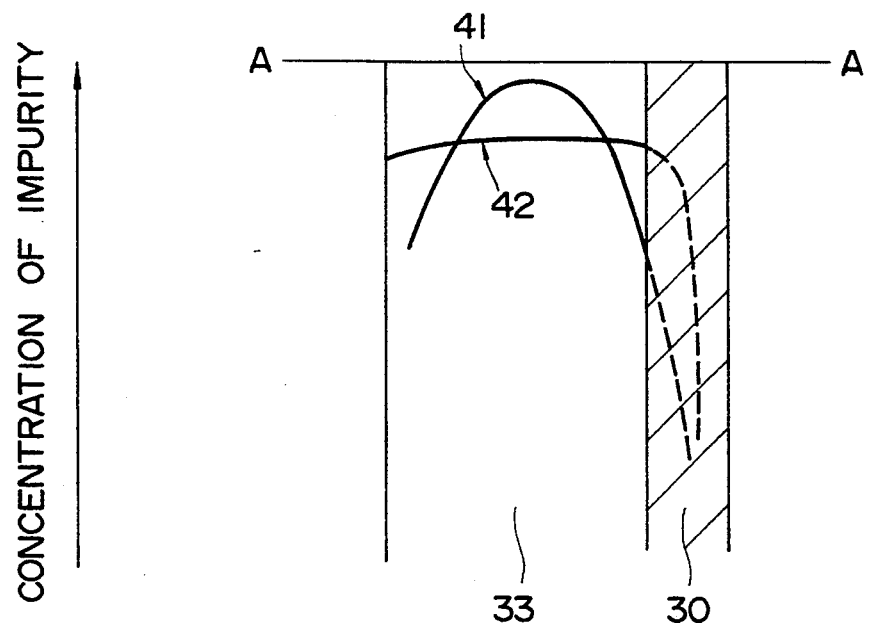
FIG. 6 is an impurity concentration profile of the SOI-type MOS transistor device of the invention along the longitudinal direction.

In FIG. 6, there is shown an impurity concentration profile along the the longitudinal direction of the SOIMOS transistor device in which the line A—A of FIG. 6 means a section taken along the line A—A of FIG. 4. The initial impurity concentration curve is indicated by reference numeral 41, from which it will be seen that the impurity is so distributed as to draw the Gauss curve about a position with a certain depth relative to both sides of the silicon surface 33 and the insulating film 30.

When the impurity distributed in such a manner as mentioned above is subjected to thermal treatment, the distribution can be expressed by a concentration profile indicated by reference numeral 42 wherein the concentration becomes substantially flat in the Si layer as shown in FIG. 6. This is ascribed to the fact that since the Si layer is made thin at the time of the thermal treatment, the impurity is substantially uniformly distributed along the depth of the ion-implanted region of the entire Si layer.

Figure 7:
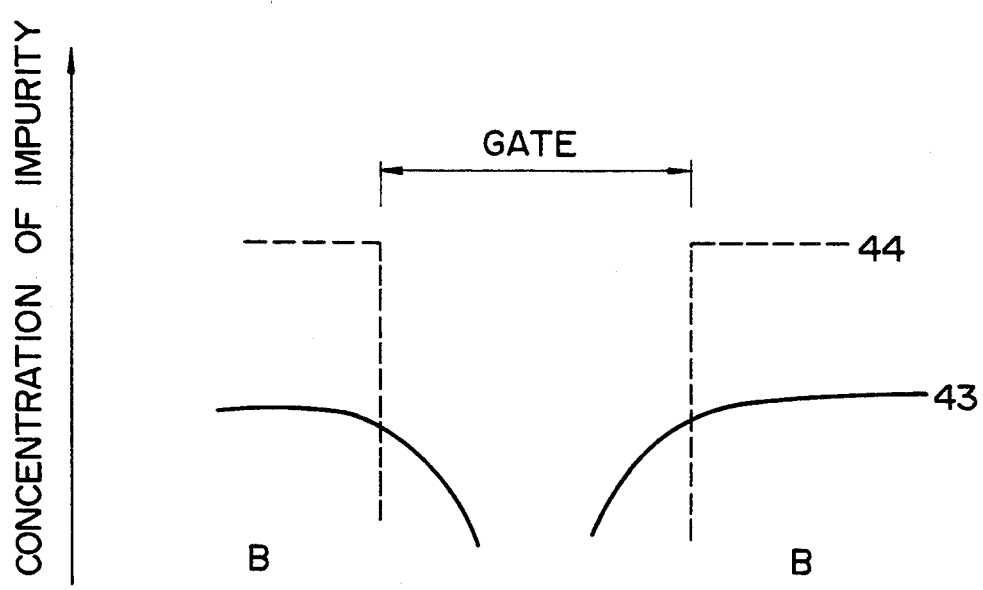
FIG. 7 is an impurity concentration profile of the SOI-type MOS transistor device of the invention shown in FIG. 4 along the transverse direction.

FIG. 7 shows part of an impurity concentration profile in lateral directions of the SOIMOS transistor device in the vicinity of the gate electrode.

This concentration profile is one which is obtained after completion of the thermal treatment. The solid lines indicated by reference numeral 43 are for concentration profiles of the low concentration impurities 34, 35 and reference numeral 44 indicates concentration profiles of highly concentrated impurities 32, 33.

As will be apparent from the above, the regions 34, 35 as shown in FIG. 4 have, respectively, the impurity substantially diffused in lateral directions. This is because the diffusion rate in the Si layer is faster than that in the SiO₂ insulating film during the thermal treatment.

During the course of the thermal treatment for the side or lateral diffusion, the impurity may, more or less, be diffused in the SiO₂ film. However, since the SiO₂ film is insulating in nature, the side diffusion does not adversely influence electric characteristics of the SOIMOS transistor device.

As stated hereinbefore, the SOIMOS transistor device of the invention is characterized in that an impurity is doped in the SOI layer through the gate electrode mask formed on the SOI layer to form a source and a drain, from which the impurity is diffused in the lateral directions to provide lower impurity concentration regions extending from the source and the drain, respectively, at the portions under the gate electrode and low impurity concentration regions are formed by diffusion of the impurity from the source and the drain in lateral directions to extend beneath the gate electrode.

The SOIMOS transistor device of the invention has such low impurity concentration regions beneath the gate electrode by diffusion of the impurity from the source and the drain, so that the drain breakdown voltage can be increased while not increasing the source resistance. This can be realized without formation of any gate electrode with a specific shape or without formation of side walls or without oblique ion implantation. This leads to a final transistor device having a low source resistance and a high drain breakdown voltage without involving any difficulty in the process control or a lowering of reproducibility.

What is claimed is:

1. A method for manufacturing a SOI MOS transistor device comprising the steps of:
 providing a substrate;
 forming an insulating film on a surface of said substrate;
 forming an SOI layer which has a thickness of 0.1 μm or less on said insulating film;
 forming a gate insulating film on a portion of said SOI layer;
 first ion implanting an n-type low concentration impurity into said SOI layer, using said gate electrode as a mask, to form a source region and a drain region;
 applying a thermal treatment to said device to form a lightly-doped source region and a lightly-doped drain region by side diffusion of said n-type low concentration impurity in said course region and said drain region, under the opposite side edges of said gate electrode, said lightly doped source region and said light-doped drain region disposed below and under the side edges of said gate electrode; and second ion implanting an n-type high concentration impurity into said SOI layer using said gate electrode as a mask to form said source region and said drain region.

2. A method for manufacturing a SOIMOS transistor device comprising the steps of:

forming an SOI layer which has a thickness of 0.1 μm or less on a substrate;

forming a gate electrode over a portion of said SOI layer;

first implanting a low concentration impurity of a first type into said SOI layer using said gate electrode as a mask to form a source region, a drain region and a channel region, said channel region disposed below said portion of said SOI layer over which said gate electrode is formed;

applying a thermal treatment to said device to produce a low concentration impurity of said first type source region and a low concentration impurity of said first type drain region, said low concentration impurity source region disposed under the side edge of said gate electrode between said channel region and said source region, and said low concentration impurity drain region disposed under the side edge of said gate electrode between said channel region and said drain region; and second implanting said SOI layer with a high concentration impurity of said first type using said gate electrode as a mask so as to increase the first type of impurity concentration in and form said source and drain regions.

* * * * *